United States Patent [19]

Southward et al.

[11] Patent Number: 6,019,926
[45] Date of Patent: *Feb. 1, 2000

[54] REFLECTIVE SILVERED POLYIMIDE FILMS VIA IN SITU THERMAL REDUCTION SILVER (I) COMPLEXES

[75] Inventors: Robin E. Southward; David W. Thompson, both of Williamsburg; Anne K. St. Clair, Poquoson; Diane M. Stoakley, Yorktown, all of Va.

[73] Assignee: The United States of America as represented by the Administrator of the National Aeronautics and Space Adminstration, Washington, D.C.

[*] Notice: This patent is subject to a terminal disclaimer.

[21] Appl. No.: 09/026,591

[22] Filed: Feb. 20, 1998

Related U.S. Application Data

[60] Provisional application No. 60/037,959, Feb. 20, 1997.

[51] Int. Cl.$^7$ .............................. B29C 41/24; B29D 11/00
[52] U.S. Cl. ......................... 264/216; 252/506; 252/514; 264/1.9; 427/162; 428/208; 524/600
[58] Field of Search ............................. 264/1.9, 216, 1.1; 427/96, 207.1, 162; 428/208; 528/353; 524/600, 607, 599; 252/506, 514, 518

[56] References Cited

U.S. PATENT DOCUMENTS

| | | |
|---|---|---|
| 3,073,784 | 1/1963 | Endrey . |
| 5,376,209 | 12/1994 | Stoakley et al. . |
| 5,520,960 | 5/1996 | Rancourt et al. . |
| 5,677,418 | 10/1997 | Thompson et al. . |

*Primary Examiner*—Mathieu D. Vargot
*Attorney, Agent, or Firm*—Hillary W. Hawkins

[57] ABSTRACT

Self-metallizing, flexible polyimide films with highly reflective surfaces are prepared by an in situ self-metallization procedure involving thermally initiated reduction of polymer-soluble silver(I) complexes. Polyamic acid solutions are doped with silver(I) acetate and solubilizing agents. Thermally curing the silver(I)-doped resins leads to flexible, metallized films which have reflectivities as high as 100%, abrasion-resistant surfaces, thermal stability and, in some cases, electrical conductivity, rendering them useful for space applications.

6 Claims, No Drawings

REFLECTIVE SILVERED POLYIMIDE FILMS VIA IN SITU THERMAL REDUCTION SILVER (I) COMPLEXES

CLAIM OF BENEFIT OF PROVISIONAL APPLICATION

Pursuant to 35 U.S.C. Section 119, the benefit of priority from provisional application 60/037,959, with a filing date of Feb. 20, 1997, is claimed for this non-provisional application.

ORIGIN OF THE INVENTION

The invention described herein was made jointly in the performance of work under a NASA grant and by employees of the U.S. Government. In accord with 35 U.S.C. 202 the contractor elected not to retain title.

BACKGROUND OF THE INVENTION

1. Field of the Invention

This invention relates generally to polyimides. It relates particularly to self-metallizing, flexible polyimide films having highly reflective surfaces, which are prepared by an in situ self-metallization procedure.

2. Description of the Related Art

State-of-the-art reflective polymer films are currently produced by multiple step methods, such as sputter-coating, metal vapor deposition, electrodeposition or electroless chemical reduction, which involve physically adding a metal layer to the surface of a polymer film. In addition to having more than one step, this type of procedure yields reflective films in which the integrity of the metal-polymer interface is less than optimal, and because of the equipment used, the area of film that can be metallized at a given time is limited.

Metallic silver has a singularly high reflection coefficient (0.93) and thus, it is highly desirable as a reflecting material. In past work, polyimides modified with silver additives have occasionally produced metallic surfaces [A. L. Endrey, U.S. Pat. No. 3,073,784 (1963); A. Auerbach, *J. Electrochem. Soc.: Accelerated Brief Comm.*, 937 (April 1984)]. Although the surfaces of the films prepared in these investigations were sometimes described as reflective, no quantitative measurements of this property were made. The technique of metal interlayer deposition has been used to produce reflective and conductive silver interlayers in polyimides in which the reflectivity was measured [S. Mazur, U.S. Pat. No. 4,512,855 (1985)]. Reflectivities of the metallized interlayers made in this fashion were between 6 and 36%.

Polyimides which have been reported as having metallized and/or reflective surfaces have as a rule been doped with silver concentrations as high as 25%. Silver has been shown to inhibit the imidization process, thus leading to reduced thermal stability and increased polymer degradation [J. T. Young, W. H. Tsai and F. J. Boerio, *Macromolecules*, 25,887 (1992)]. For this reason, although the highly-doped polyimide films of past work were suitable for decorative purposes, they were neither flexible nor thermally stable enough to be considered for use in large space structures such as metallic reflectors, concentrators, or antennas which require the ability to be packaged into relatively small volumes of low weight and subsequently unfurled upon deployment. Furthermore, the silver additive utilized in most of the past studies was silver nitrate. Other silver additives are not soluble in polyamic acid resins, and either cause gellation or precipitate out of solution. Silver nitrate, although readily soluble in polyamic acid resins, produces brittle films.

SUMMARY OF THE INVENTION

Accordingly, an object of the present invention is to provide a process for rendering an aromatic condensation polyimide reflective.

Another object of the present invention is to provide aromatic condensation polyimide films and coatings that have surface reflectivities up to 100% compared to an optical mirror.

Another object of the present invention is to provide self-metallizing, reflective polyimide films that are flexible, abrasion-resistant and thermally stable.

Another object of the present invention is to provide self-metallizing, reflective polyimide films and coatings that are flexible, abrasion-resistant, high temperature stable and surface conductive.

The present invention offers a highly efficient method of manufacturing reflective polyimide films that produces high quality films by adding metal to the polymer before heat treatment, and then heating the mixture to form a self-metallizing polymer film having desired properties. By the present method, there is no limit to the size or area of metallized film that can be produced.

By the present invention, a solubilizing process was employed using silver(I) acetate and a variety of solubilizing agents to produce aromatic condensation polyimide films and coatings which have metallized surfaces with reflectivities as high as 100% and, in some cases, with electrically conductive surfaces as well, further enhancing their suitability for space applications. In addition to their applicability in large space structures, the films and coatings of this invention have utility as bactericidal coatings, surface conductive flexible polymeric tapes, contacts in microelectronics and in the construction of adaptive and elastomeric optical devices. The high reflectivity of these self-metallizing films and coatings is achieved in the present invention without sacrificing the flexibility and thermal stability required for such uses. In some cases the reflectivity of these films may be further enhanced by polishing with a standard silver polishing cloth as noted in several of the examples below. The integrity of the metal-polymer interface is excellent in the current invention because of the formation of a chemical bond during the heat treatment process, which yields metallized surfaces that are abrasion-resistant. In addition to their high reflectivities, some of the films of this invention are surface conductive, either before and/or after polishing with a standard silver polishing cloth.

DESCRIPTION OF THE PREFERRED EMBODIMENT

Preparation of polyimide films and coatings involves the room temperature reaction in a solvent of an aromatic diamine with an aromatic dianhydride to yield a polyamic acid. Polyamic acid resin is thermally imidized by heating at 250° C. or above.

The polyamic acids of this invention involve the addition of an equimolar quantity of 3,3'1,4,4'-benzophenonetetracarboxylic dianhydride (BTDA) to a stirred solution of 4,4'-oxydianiline (ODA) in an amide-type solvent. Although BTDA and ODA were used for the specific examples, other dianhydrides and diamines may be employed. Dianhydrides such as 4,4'-oxydiphthalic anhydride (ODPA), 2,2-bis(3,4-dicarboxyphenyl) hexafluoropropane dianhydride (6FDA) or 4,4'-bis(3,4-dicarboxyphenoxy)diphenyl sulfide dianhydride can be substituted. Other diamines that are useful in the present invention include any isomer of diaminobenzophenone, diaminodiphenylmethane, phenylenediamine, diaminodiphenylsulfone and bis(aminophenoxy)phenylhexafluoropropane.

Silver(I) acetate is not soluble in polyamic acid solutions in dimethylacetamide (DMAc). In the present invention, silver acetate was solubilized by combining it with an excess of a solubilizing agent in a small amount of DMAc prior to adding it to the polymer solution. Without the solubilizer, the doped solution gels or the metal additive refuses to dissolve. Included in the examples of the solubilizing agents of the present invention are: 1,1,1-trifluoro-2,4-pentanedione; 3-cyano-2,4-pentanedione and triphenylphosphine; 2,5-dimethyl-6,6,7,7,8,8,8-heptafluoro-3,5-octanedione; and 1,1,5,5,5-hexafluoro-2,4-pentanedione. Although these solubilizing agents were used for the specific examples, others, such as trifluoroacetic acid, perfluoropropionic acid and additional alkyl/aryl phosphines and sulfides, can be employed.

SPECIFIC EXAMPLES

Example 1

3,3',4,4'-Benzophenone tetracarboxylic dianhydride (BTDA)/4,4'-oxydianiline (ODA) poly(amic acid) resin was prepared by allowing 18.46 g (0.09219 mol) of ODA and 30.00 g (0.09310 mol) of BTDA to react in 274.5 g of dimethylacetamide (DMAc). The inherent viscosity of the solution was 1.7 dL/g at 35° C. Silver(I) acetate (0.131 g, 0.785 mmol) and 1,1,1-trifluoro-2,4-pentanedione (0.159 g, 1.03 mmol) were added to 1.254 g of DMAc. The resulting slurry was stirred for several minutes after which the poly(amic acid) solution of BTDA/ODA resin (4.994 g) was added. After stirring for 30 minutes a film was cast onto a glass plate to a wet thickness of 20 mil. The film was then thermally converted to the surface metallized polyimide film in a forced air oven by heating at 135° C. for one hour and 300° C. for four hours. The resulting metallized film was flexible and reflective with reflectivity values of 20–76% at an angle of incidence of 20° relative to a polished aluminum optical mirror. The film was not surface electrically conductive. However, polishing with a standard silver polishing cloth increased the reflectivity to 88–100% and gave a conducting surface by the four point probe technique. This film had a 10% weight loss as measured by dynamic thermogravimetric analysis (TGA) in air at 344° C.

Example 2

Silver(I) acetate (0.489 g, 2.93 mmol) and 1,1,1-trifluoro-2,4-pentanedione (0.598 g, 3.88 mmol) were added to 3.758 g of DMAc. The resulting slurry was stirred for five minutes after which the poly(amic acid) solution of the BTDA/ODA resin of Example 1 (5.017 g) was added. After stirring for 30 minutes a film was cast onto a glass plate to a wet thickness of 20 mil. The film was then thermally converted to the surface metallized polyimide film in a forced air oven by heating at 135° C. for one hour and 300° C. for five hours. The resulting metallized film was flexible and reflective with a reflectivity value of 77% at an angle of incidence of 20° relative to a polished aluminum optical mirror. The film was surface electrically conductive as ascertained by the four point probe technique.

Example 3

Silver(I) acetate (0.321 g, 1.92 mmol) and 3-cyano-2,4-pentanedione (0.243 g, 1.94 mmol) were added to 3.016 g of DMAc. The resulting suspension was stirred for one minute after which the poly(amic acid) solution of BTDA/ODA resin of Example 1 (10.017 g) was added. The inorganic constituents did not dissolve. Subsequent addition of triphenylphosphine (0.503 g, 1.98 mmol) followed by stirring gave a clear polymer solution. After stirring for 30 minutes a film was cast onto a glass plate to a wet thickness of 20 mil. The film was then thermally converted to the surface metallized polyimide film in a forced air oven by heating at 135° C. for one and 300° C. for five hours. The resulting metallized film was flexible and reflective with a reflectivity value of 62% at an angle of incidence of 20° relative to a polished aluminum optical mirror. The film was not surface electrically conductive as ascertained by the four point probe technique.

Example 4

Silver(I) acetate (0.133 g, 0.797 mmol) and 1,1,1-trifluoro-2,4-pentanedione (0.193 g, 1.25 mmol) were added to 1.019 g of DMAc. The resulting slurry was stirred for five minutes after which 5.002 g of the poly(amic acid) solution of the BTDA/ODA resin of Example 1 diluted with DMAc to 12% solids was added. After stirring for 30 minutes a film was cast onto a glass plate to a wet thickness of 20 mil. The film was then thermally converted to the surface metallized polyimide film in a forced air oven by heating at 100° C. for one hour, 200° C. for one hour and 340° C. for one hour. The resulting metallized film was flexible and reflective with a reflectivity value of 46% at an angle of incidence of 20° relative to a polished aluminum optical mirror. The film was surface electrically conductive as ascertained by the four point probe technique. Dynamic TGA gave a 10% weight loss in air at 300° C.

Example 5

Silver(I) acetate (0.147 g, 0.881 mmol) and 1,1,1-trifluoro-2,4-pentanedione (0.428 g, 2.78 mmol) were added to 2.006 g of DMAc. The resulting slurry was stirred for five minutes after which 10.017 g of the poly(amic acid) solution of the BTDA/ODA resin of Example 4 was added. After stirring for 30 minutes a film was cast onto a glass plate to a wet thickness of 25 mil. The film was then thermally converted to the surface metallized polyimide film in a forced air oven by heating at 100° C. for one hour, h, 200° C. for one hour, and 340° C. for one hour. The resulting metallized film was flexible and reflective with a reflectivity value of 49% at an angle of incidence of 20° relative to a polished aluminum optical mirror. The film was not surface electrically conductive as ascertained by the four point probe technique. The 10% weight loss in air was at 367° C. as determined by dynamic TGA.

Example 6

The BTDA/ODA resin of Example 4 (12% solids) was cast onto a glass plate at a wet thickness of 12 mil. The film was imidized by the following thermal cure cycle: 100° C. for one hour, 200° C. for one hour, and 300° C. for one hour. Silver(I) acetate (0.325 g, 1.94 mmol) and 1,1,1-trifluoro-2,4-pentanedione (0.404 g, 2.62 mmol) were added to 2.990 g of DMAc. The resulting slurry was stirred for five minutes after which the poly(amic acid) solution of the BTDA/ODA resin, prepared at 15% solids and an inherent viscosity of 1.2 dL/g at 35° C., was added (10.240 g). After stirring for 30 minutes a film was cast onto the glass plate containing the undoped BTDA/ODA base to a wet thickness of 12 mil. The silver(I)-doped film was then thermally converted to the surface metallized polyimide film in a forced air oven by heating at 135° C. for one hour and 300° C. for seven hours. The resulting metallized film was flexible and reflective with reflectivity values of 95–100% at an angle of incidence of 20° relative to a polished aluminum optical mirror. The film was surface electrically conductive as ascertained by the four point probe technique.

Example 7

Silver(I) acetate (0.320 g, 1.92 mmol) and 2,5-dimethyl-6,6,7,7,8,8,8-heptafluoro-3,5-octanedione (0.598 g, 2.02 mmol) were added to 3.000 g of DMAc. The resulting slurry was stirred for five minutes after which the poly(amic acid) solution of the BTDA/ODA resin of Example 1 was added (10.070 g). After stirring for 30 minutes a film was cast onto a glass plate to a wet thickness of 20 mil. The film was then thermally converted to the surface metallized polyimide film in a forced air oven by heating at 135° C. for one hour and 300° C. for seven hours. The resulting metallized film was flexible and reflective with a reflectivity value of 78% at an angle of incidence of 20° relative to a polished aluminum optical mirror. The film was surface electrically conductive as ascertained by the four point probe technique.

Example 8

The BTDA/ODA resin of Example 4 (12% solids) was cast onto a glass plate at a wet thickness of 12 nil. The film was imidized by the following thermal cure cycle: 100° C. for one hour, 200° C. for one hour, and 300° C. for one hour. Silver(I) acetate (0.245 g, 1.47 mmol) and 1,1,1,5,5,5-hexafluoro-2,4-pentanedione (0.328 g, 1.59 mmol) were added to 1.484 g of DMAc. The resulting slurry was stirred for five minutes after which the poly(amic acid) solution of the BTDA/ODA resin, prepared at 15% solids and an inherent viscosity of 1.2 dL/g at 35° C., was added (7.565 g). After stirring for 30 minutes a film was cast onto the glass plate containing the undoped BTDA/ODA base to a wet thickness of 12 mil. The silver(I)-doped film was then thermally converted to the surface metallized polyimide film in a forced air oven by heating at 135° C. for one hour and 300° C. for seven hours. The resulting metallized film was flexible and reflective with reflectivity value of 81% at an angle of incidence of 20° relative to a polished aluminum optical mirror. The film was not surface electrically conductive as ascertained by the four point probe technique. Dynamic TGA gave a 10% weight loss in air at 340° C.

We claim:

1. A process for producing a self-metallizing, reflective polyimide film which is flexible, abrasion-resistant, and thermally stable, which process comprises:

reacting an aromatic dianhydride with an aromatic diamine in a solvent to produce a polyamic acid solution;

combining silver(I) acetate with an effective amount of a solubilizing agent therefor in the solvent to yield solubilized silver(I) acetate;

doping the polyamic acid solution with the solubilized silver(I) acetate;

preparing a film from the polyamic acid solution which has been doped with the solubilized silver(I) acetate; and curing the film to convert the polyamic acid to the corresponding polyimide and reduce the solubilized silver(I) acetate to metallic silver.

2. The process of claim 1, wherein the film is thermally cured to convert the polyamic acid to the corresponding polyimide and to reduce the solubilized silver(I) acetate to metallic silver.

3. The process of claim 1, wherein the aromatic dianhydride is selected from the group consisting of 3,3',4,4'-benzophenonetetracarboxylic dianhydride; 4,4'-oxydiphthalic anhydride; 2,2-bis(3,4-dicarboxyphenyl) hexafluoropropane dianhydride; and 4,4'-bis(3,4-dicarboxyphenoxy)diphenyl sulfide dianhydride; and the aromatic diamine is selected from the group consisting of 4,4'-oxydianiline; diaminobenzophenone; diaminodiphenylmethane; phenylenediamine; diaminodiphenylsulfone; and bis(aminophenoxy)phenylhexafluoropropane.

4. The process of claim 1, wherein the solubilizing agent for silver(I) acetate is selected from the group consisting of 1,1,1-trifluoro-2,4-pentanedione; 3-cyano-2,4-pentanedione and triphenylphosphine; 2,5-dimethyl-6,6,7,7,8,8,8-heptafluoro-3,5-octanedione; 1,1,5,5,5-hexafluoro-2,4-pentanedione; trifluoroacetic acid; and perfluoropropionic acid.

5. The process of claim 1, wherein the film is prepared by casting the polyamic acid solution which has been doped with the solubilized silver(I) acetate.

6. A self-metallizing, reflective polyimide film which is flexible, abrasion-resistant, and thermally-stable, which is prepared by the process of claim 2.

* * * * *